(12) United States Patent
Lin

(10) Patent No.: US 8,786,334 B2
(45) Date of Patent: Jul. 22, 2014

(54) LOCK DETECTION CIRCUIT AND PHASE-LOCKED LOOP CIRCUIT INCLUDING THE SAME

(75) Inventor: Guangyuan Lin, Hangzhou (CN)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 150 days.

(21) Appl. No.: 13/192,975

(22) Filed: Jul. 28, 2011

(65) Prior Publication Data

US 2012/0025883 A1    Feb. 2, 2012

(30) Foreign Application Priority Data

Jul. 30, 2010  (CN) .......................... 2010 1 0244514
Jul. 5, 2011   (KR) ......................... 10-2011-0066445

(51) Int. Cl.
    *H03L 7/06*    (2006.01)

(52) U.S. Cl.
    USPC .......................................... 327/156; 327/147

(58) Field of Classification Search
    USPC ................................. 327/147, 156
    See application file for complete search history.

(56) References Cited

U.S. PATENT DOCUMENTS

| | | | |
|---|---|---|---|
| 6,927,635 B2* | 8/2005 | Miki et al. | 331/1 A |
| 7,102,393 B2 | 9/2006 | Tso et al. | |
| 7,342,427 B1* | 3/2008 | Fensore et al. | 327/157 |
| 7,511,543 B2* | 3/2009 | Friedman et al. | 327/156 |
| 8,040,156 B2* | 10/2011 | Lee et al. | 327/20 |
| 8,253,451 B1* | 8/2012 | Hsieh et al. | 327/141 |
| 8,258,831 B1* | 9/2012 | Banai et al. | 327/155 |
| 8,274,339 B2* | 9/2012 | Fan et al. | 331/176 |
| 8,368,439 B2* | 2/2013 | Jang et al. | 327/156 |
| 8,482,327 B2* | 7/2013 | Lim et al. | 327/158 |
| 2006/0097763 A1* | 5/2006 | Schmitt et al. | 327/158 |
| 2008/0084233 A1* | 4/2008 | Lee | 327/156 |
| 2008/0089459 A1* | 4/2008 | Vlasenko et al. | 375/376 |
| 2008/0309386 A1* | 12/2008 | Vlasenko | 327/157 |
| 2010/0052752 A1* | 3/2010 | Lee et al. | 327/159 |
| 2010/0156483 A1* | 6/2010 | Mai | 327/157 |
| 2011/0227616 A1* | 9/2011 | Jang et al. | 327/157 |
| 2011/0254601 A1* | 10/2011 | Xiu | 327/157 |

FOREIGN PATENT DOCUMENTS

| | | |
|---|---|---|
| JP | 2006-203814 | 8/2006 |
| KR | 1020010084067 | 9/2001 |

* cited by examiner

*Primary Examiner* — Adam Houston
(74) *Attorney, Agent, or Firm* — F. Chau & Associates, LLC (57) ABSTRACT

A phase-locked loop circuit including a lock detector is provided comprising a delay circuit including a load capacitor, and a bias circuit configured to generate a constant reference current, wherein the load capacitor is charged or discharged with a current whose level is dependent upon the reference current.

14 Claims, 6 Drawing Sheets

LOCK DETECTION CIRCUIT AND PHASE-LOCKED LOOP CIRCUIT INCLUDING THE SAME

CROSS-REFERENCE TO RELATED APPLICATIONS

This application claims the benefit of Korean Patent Application No. 10-2011-0066445, filed on Jul. 5, 2011, in the Korean Intellectual Property Office, and Chinese Patent Application No. 201010244514.3, filed on Jul. 30, 2011, in the Chinese Patent Office, the disclosures of which are incorporated by reference herein in their entirety.

BACKGROUND

The embodiments of the inventive concept are directed to detection of a lock state of a phase-locked loop (PLL) circuit, and more particularly, to a lock detection circuit and a PLL circuit including the lock detection circuit.

Phase-locked loop (PLL) circuits are widely used in communications, multimedia, and other applications, such as, for example, frequency synthesizers, FM demodulators, block recovery circuits, modems, and tone decoders.

A PLL circuit includes a lock detection circuit capable of detecting a lock state. However, as a bias voltage used in the lock detection circuit varies depending on changes in process-voltage-temperature (PVT) parameters and other greatly fluctuating parameters, a delay time changes together with the bias voltage. Thus, the lock detection circuit cannot accurately detect a lock state in the PLL circuit.

SUMMARY

The embodiments of the inventive concept provides a phase-locked loop (PLL) circuit capable of accurately detecting a lock state and a lock detector configured to accurately detect a lock state of the PLL circuit.

According to an embodiment of the inventive concept, there is provided a PLL circuit comprising a comparator configured to compare phases of an input clock signal and an output clock signal to generate phase comparison signals SUP and SDN, a pulse generator configured to generate a first pulse signal based on the phase comparison signals SUP and SDN. The PLL circuit includes a bias circuit configured to generate a first current $I_1$ and a second current $I_2$ proportional to the first current, which flow between a power supply and a ground and a delay circuit configured to draw third and fourth currents $I_3$ and $I_4$ proportional to the first and second currents, respectively, and configured to receive the first pulse signal to generate a second pulse signal by delaying the first pulse signal by a delay time TD using the third and fourth currents $I_3$ and $I_4$. The first current $I_1$ is stabilized to a predetermined reference current level despite fluctuations in a voltage of the power supply.

The bias circuit may include a first N-type metal-oxide-semiconductor field-effect transistor (NMOSFET) and a bias resistor through which the first current flows; a second NMOSFET through which the second current flows; and a current mirror mirroring the second current from the first current. The first NMOSFET may have a drain coupled to the power supply through the current mirror and a source coupled to the ground through the bias resistor. A gate and a drain of the second NMOSFET and a gate of the first NMOSFET may be jointly connected to the power supply through the current mirror, and a source of the second NMOSFET may be connected to the ground.

The reference current level of the first current $I_1$ may depend on a size of the first NMOSFET, a value of the bias resistor, and a size ratio between the first and second NMOSFETs and may be constant regardless of fluctuations in the voltage level of the power supply.

A rate of a current level of the first current to a current level of the second current may be 1:1.

The delay circuit may include at least one delay unit including an inverting portion having an input terminal and an output terminal. The inverting portion may include a load capacitor equivalently present between the output terminal and the ground. The load capacitor may be charged and discharged with the third current and the fourth current, respectively, at constant speed.

The third current and the fourth current may be mirrored to the first current and the second current, respectively.

The bias circuit may include a self-bias circuit configured to self-bias the first current and the second current, a switching current configured to activate or deactivate the self-bias circuit in response to a first signal, and a start circuit configured to release a zero state of the self-bias circuit.

According to an embodiment of the inventive concept, there is provided a lock detector in a phase-locked loop (PLL) circuit, including an NOR circuit, a delay circuit including at least one delay unit, a bias circuit configured to provide a bias signal to the at least one delay unit, and a trigger configured to detect a lock state of the PLL circuit based on output signals from the NOR circuit and the delay circuit. The bias circuit includes first and second PMOSFETs, first and second NMOSFETs, and a bias resistor $R_{BIAS}$. The first PMOSFET has a source connected to a power supply and a drain connected to a drain and a gate of the first NMOSFET, and the first NMOSFET has its source connected to a ground. The second PMOSFET has a source connected to the power supply and a drain connected to its gate and a drain of the second NMOSFET, and the second NMOSFET has its source connected to the ground through the bias resistor. A gate of the first PMOSFET is connected to the gate of the second PMOSFET, and the gate of the first NMOSFET is connected to a gate of the second NMOSFET. At least one of a voltage at the gate of the first PMOSFET and a voltage at the gate of the first NMOSFET is used as the bias signal.

The bias circuit may further include a switch circuit having a third PMOSFET and a third NMOSFET. The PMOSFET has a source connected to the power supply, a drain connected to the gate of the first PMOSFET, and a gate receiving a first signal RSTB. The third NMOSFET has a source connected to the ground, a drain connected to the gate of the first NMOSFET, and a gate receiving a second signal RST.

When the bias circuit is deactivated, the first signal is at a low level and the second signal is at a high level. When the bias circuit is activated, the first signal is at a high level and the second signal is at a low level.

The bias circuit may further include a zero-state start circuit including a fourth PMOSFET and fourth through sixth NMOSFETs. The fourth PMOSFET has a gate connected to a gate of the sixth NMOSFET and receiving the second signal, a source connected to the power supply, and a drain connected to a drain of the sixth NMOSFET, a gate of the fourth NMOSFET and a drain of the fifth NMOSFET. The sixth NMOSFET has its source connected to the ground. The fourth NMOSFET has a drain connected to the drain of the second PMOSFET and a source connected to a gate of a fifth NMOSFET and the gate of the second NMOSFET. The fifth NMOSFET has its source connected to the ground.

The bias circuit may further include a fifth PMOSFET and a seventh NMOSFET. The fifth PMOSFET has a source connected to the power supply and a drain connected to a drain of the seventh NMOSFET. The seventh NMOSFET has its source connected to the ground. A gate of the fifth PMOSFET is connected to a gate of the seventh NMOSFET. The gate of the fifth PMOSFET receives the first signal RSTB and the drain of the fifth PMOSFET outputs the second signal RST.

The at least one delay unit may include sixth and seventh PMOSFETs and eighth and ninth NMOSFETs. The sixth PMOSFET has a source connected to the power supply and a drain connected to a source of the seventh PMOSFET. The seventh PMOSFET has its drain connected to a drain of the ninth NMOSFET. The ninth NMOSFET has its source connected to a drain of the eighth NMOSFET. The eighth NMOSFET has its source connected to the ground. Gates of the sixth PMOSFET, the eighth NMOSFET, and the seventh PMOSFET are respectively connected to gates of the second PMOSFET, the second NMOSFET, and the ninth NMOSFET. The gate of the seventh PMOSFET receives a data signal and the drain of the seventh PMOSFET outputs an inverted version of the data signal.

The at least one delay unit may include sixth and seventh PMOSFETs and a ninth NMOSFET. The sixth PMOSFET has a source connected to the power supply and a drain connected to a source of the seventh PMOSFET. The seventh PMOSFET has its drain connected to a drain of the ninth NMOSFET. The ninth NMOSFET has its source connected to the ground. Gates of the sixth and seventh PMOSFETs are respectively connected to gates of the second PMOSFET and the ninth NMOSFET. The gate of the seventh PMOSFET receives a data signal and the drain of the seventh PMOSFET outputs an inverted version of the data signal.

The at least one delay unit may include a seventh PMOSFET and eighth and ninth NMOSFETs. The seventh PMOSFET has a source connected to the power supply and a drain connected to the drain of the ninth NMOSFET. The ninth NMOSFET has its source connected to a drain of the eighth NMOSFET. The eighth NMOSFET has its source connected to the ground. Gates of the eighth NMOSFET and the seventh PMOSFET are respectively connected to gates of the second NMOSFET and the ninth NMOSFET. The gate of the seventh PMOSFET receives a data signal and the drain of the seventh PMOSFET outputs an inverted version of the data signal.

According to an embodiment, there is provided a phase-locked loop circuit including a lock detector, the phase-locked loop circuit comprising a delay circuit including a load capacitor and a bias circuit configured to generate a constant reference current, wherein the load capacitor is charged or discharged with a current whose level is dependent upon the reference current.

The bias circuit comprises first and second P-type transistors, wherein sources of the P-type transistors are connected to the power supply, gates of the P-type transistors are connected to each other, first and second N-type transistors, wherein drains of the P-type transistors are respectively connected to drains of the N-type transistors, gates of the N-type transistors are connected to each other, and a source of the first N-type transistor is connected to a ground, and a bias resistor, wherein source of the second N-type transistor is connected to the ground via the bias resistor, and wherein the gate and the drain of the second P-type transistor are connected to each other, and the gate and the drain of the first N-type transistor are connected to each other.

The delay circuit comprises third and fourth P-type transistors, wherein a source of the third P-type transistor is connected to the power supply, a gate of the third P-type transistor is connected to the gate of the second P-type transistor, and a drain of the third P-type transistor is connected to a source of the fourth P-type transistor, and third and fourth N-type transistors, wherein a source of the third N-type transistor is connected to the ground, a gate of the third N-type transistor is connected to the gate of the first N-type transistor, and a drain of the third N-type transistor is connected to a source of the fourth N-type transistor, and wherein a gate and a drain of the fourth P-type transistor are respectively connected to a gate and a drain of the fourth N-type transistor.

The fourth P-type transistor and the fourth N-type transistor constitute an inversion portion that includes an input terminal connected to the gates of the fourth P-type transistor and the fourth N-type transistor and an output terminal connected to the drains of the fourth P-type transistor and the fourth N-type transistor, wherein the load capacitor is an equivalent capacitor between the output terminal and the ground.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Various and illustrative embodiments will now be described more fully with reference to the accompanying drawings. Like reference numerals may refer to like or similar elements throughout the specification and the drawings.

Figure 1:
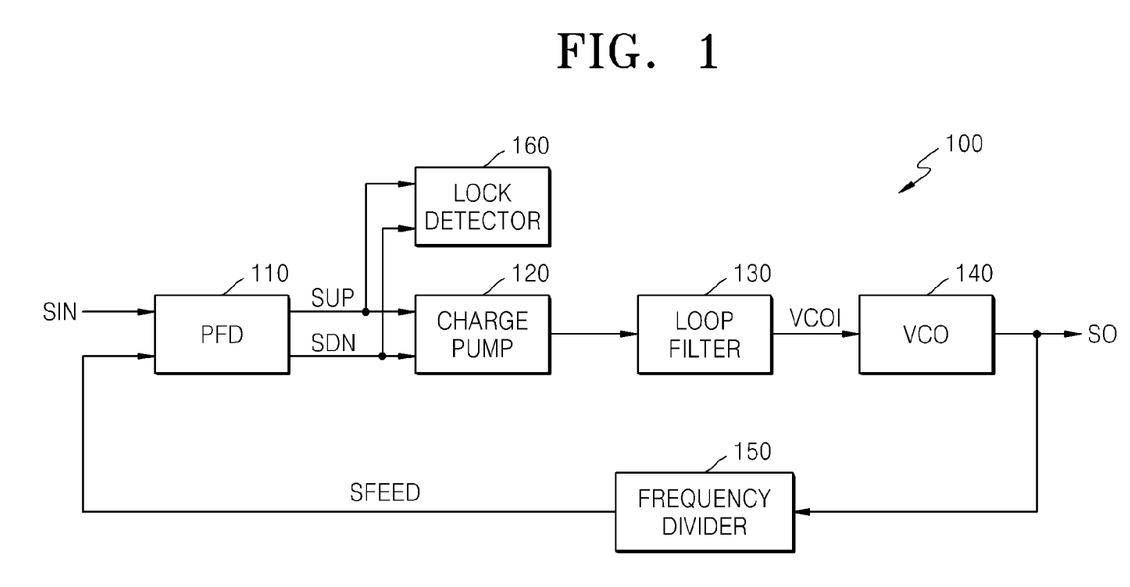
FIG. 1 is a block diagram of a phase-locked loop circuit according to an embodiment of the present inventive concept.

FIG. 1 is a block diagram of a phase-locked loop (PLL) circuit 100 according to an embodiment of the present inventive concept. Referring to FIG. 1, the PLL circuit 100 according to the present embodiment includes a phase-frequency detector (PFD) 110, a charge pump 120, a loop filter 130, a voltage-controlled oscillator (VCO) 140, a frequency divider 150, and a lock detector 160.

The PFD 110 generates phase comparison signals SUP and SDN based on a phase difference between an input clock signal SIN, which is a reference signal, and a feedback signal SFEED. The charge pump 120 generates an output signal having different levels according to the state of the phase comparison signals SUP and SDN. The loop filter 130 filters out a high frequency component of the output signal from the charge pump 120 and provides a resulting signal including a voltage VCOI to an input terminal of the VCO 140. The VCO 140 produces output clock signals SO having different frequencies according to a DC level of the voltage VCOI. The frequency divider 150 generates the feedback signal SFEED based on the output clock signals SO and provides the feedback signal SFEED to the PFD 110 as an input signal. The lock detector 160 determines a lock state of the PLL circuit 100 on the basis of the phase comparison signals SUP and SDN output from the PFD 110. More specifically, when a phase difference and a frequency difference between the reference signal SIN and the feedback signal SFEED approach 0, the PLL circuit 100 is in lock.

Figure 2:
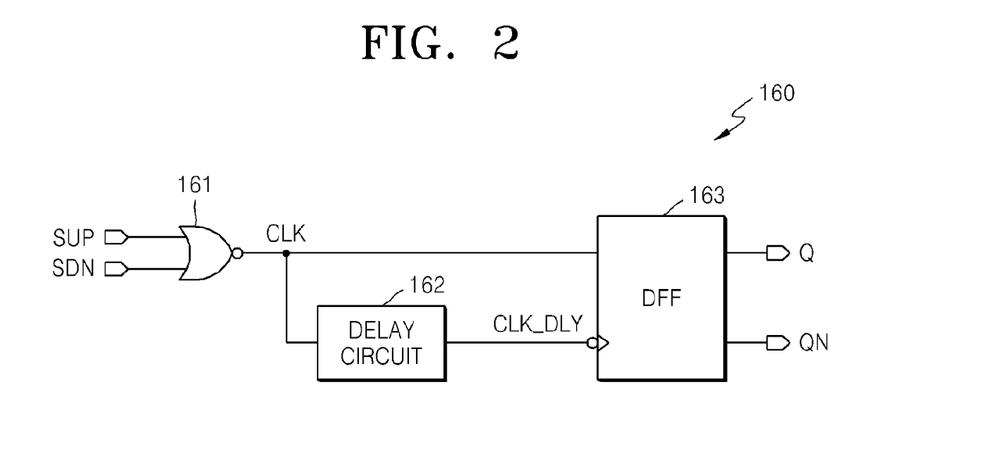
FIG. 2 illustrates a lock detector according to an embodiment of the present inventive concept.

FIG. 2 illustrates the lock detector 160 according to an embodiment of the present inventive concept.

Referring to FIG. 2, the lock detector 160 includes an NOR circuit 161, a delay circuit 162, and a D-type flip-flop (DFF) 163.

The NOR circuit 161 performs an "NOR" operation on the phase comparison signals SUP and SDN output from the PFD 110 and outputs a first pulse signal CLK. The delay circuit 162 receives the first pulse signal CLK and delays the first pulse signal CLK by a predetermined delay time TD to generate a second pulse signal CLK_DLY. The DFF 163 receives the first and second pulse signals CLK and CLK_DLY and detects a state of the first pulse signal CLK in response to the second pulse signal CLK_DLY. Based on an output of the DFF 163, a pulse width TW of the first pulse signal CLK is compared with the delay time TD. When the pulse width TW of the first pulse signal CLK is smaller than the delay time TD, an output Q of the DFF 163 has a high level. When the pulse width TW of the first pulse signal CLK is greater than the delay time TD, the output QD of the DFF 163 has a low level. The output Q of the DFF 163 having a high level indicates that the PLL circuit 100 is in a lock state. The DFF 163 is also called a trigger.

While FIG. 2 shows the first pulse signal CLK generated by the NOR circuit 161 is used as an input to the delay circuit 162, any reference signals, such as reference signals generated by a reference signal generator, may be fed into the delay circuit 162.

Figure 3:
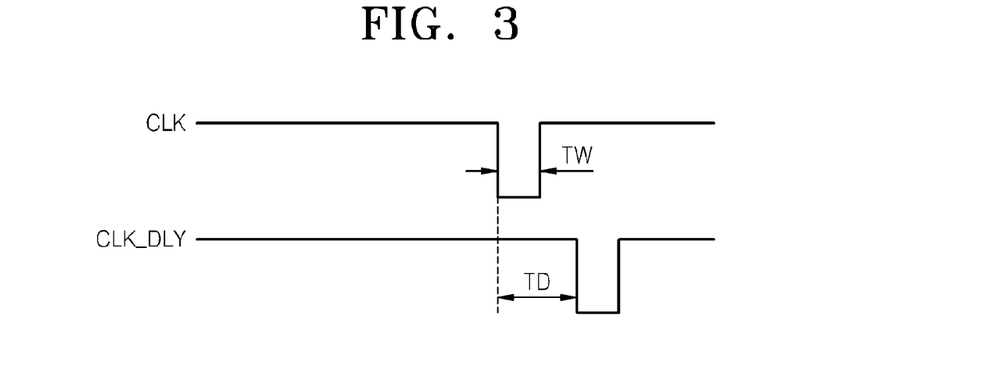
FIG. 3 is a timing diagram of first and second pulse signals shown in FIG. 2.

FIG. 3 is a timing diagram illustrating the first and second pulse signals CLK and CLK_DLY shown in FIG. 2.

Referring to FIG. 3, the first pulse signal CLK maintains a high state except that the first pulse signal CLK has a low state for the pulse width TW. The phase comparison signals SUP and SDN maintain a low level except that the signals SUP and SDN have a high level for the pulse width TW. The second pulse signal CLK_DlY is generated by delaying the first pulse signal CLK by the delay time TD. The DFF 163 outputs a state of the first pulse signal CLK in response to a falling edge of the second pulse signal CLK_DLY.

As shown in FIG. 3, when the delay time TD is greater than the pulse width TW, the output signal Q of the DFF 163 has a high level. When the delay time TD is smaller than the pulse width PW, the output signal QN of the DFF 163 has a low level. The high-level output signal Q is indicative of a lock state of the PLL circuit 100.

When a time corresponding to the pulse width PW, during which the phase comparison signal SUP or SDN have a high level, is less than the predetermined delay time TD, the PLL circuit 100 is determined to be in lock.

Figure 4:
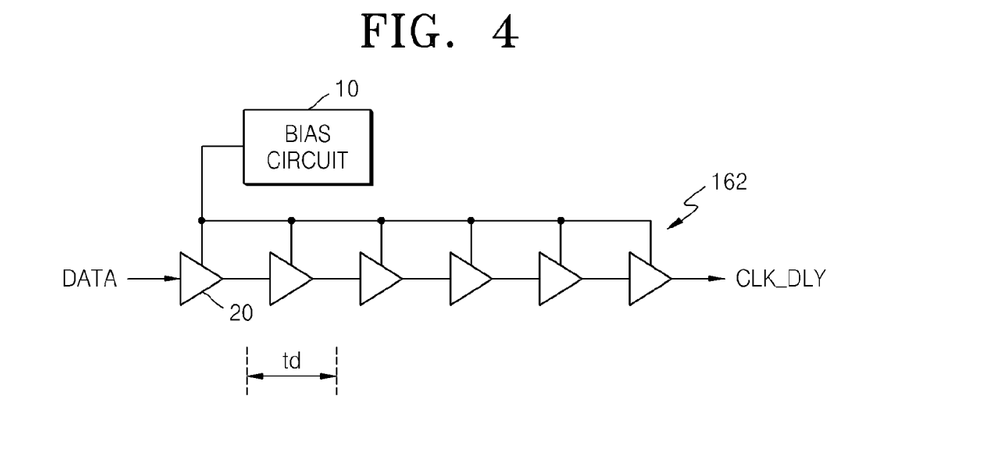
FIG. 4 schematically illustrates a delay circuit according to an embodiment of the present inventive concept.

FIG. 4 schematically illustrates the delay circuit 162 according to an embodiment of the present inventive concept.

Referring to FIG. 4, the delay circuit 162 includes at least one delay stage 20. Each delay stage 20 generates a delay time td.

As shown in FIG. 4, the delay circuit 162 includes N delay stages (N is a natural number greater than 1). According to an embodiment, the delay time TD of the N delay stages is expressed by N×td. According to an embodiment, the delay circuit 162 includes one delay stage 20.

The delay circuit 162 is biased by a bias circuit 10.

Figure 5:
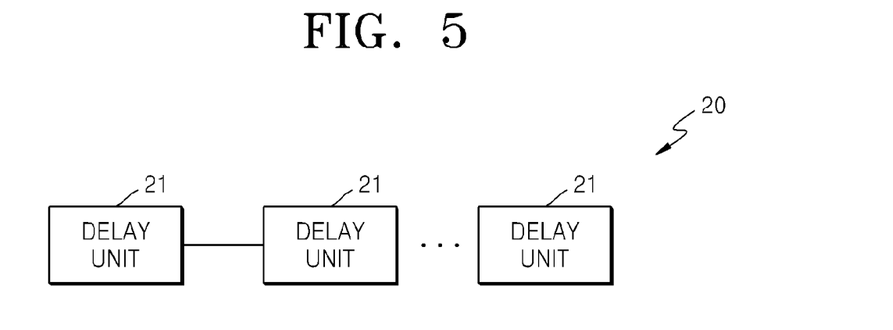
FIG. 5 schematically illustrates a delay stage according to an embodiment of the present inventive concept.

FIG. 5 schematically illustrates the delay stage 20 according to an embodiment of the present inventive concept.

Referring to FIG. 5, the delay stage 20 includes a plurality of delay units 21, which may be connected in series with each other. Alternatively, the delay circuit 162 may include a single delay unit 21.

For purposes of illustration, the delay circuit 162 is described as a single delay unit 21. However, the embodiments of the present concept will apply in the same manner when a plurality of delay units 21 are connected in series with each other to form the delay circuit 162.

Figure 6:
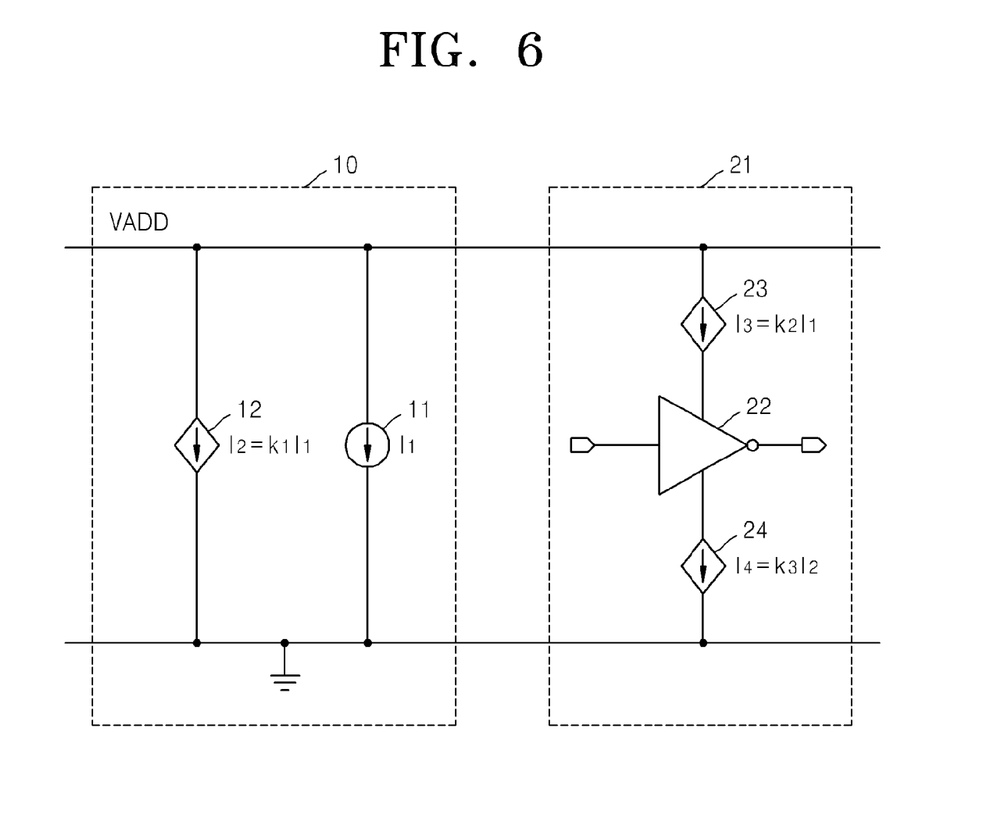
FIG. 6 schematically illustrates a bias circuit and a delay unit according to embodiments of the present inventive concept.

FIG. 6 schematically illustrates a bias circuit 10 and a delay unit 21 according to an embodiment of the present inventive concept.

Referring to FIG. 6, the bias circuit 10 includes a reference current source 11 and a dependent current source 12. The reference current source 11 allows a first current $I_1$ to flow through a first current path between power supply VADD and ground. The first current $I_1$ has a reference current level that is kept constant regardless of fluctuations in a voltage level of the power supply VADD. When the voltage level of the power supply VADD fluctuates, the current level of the first current $I_1$ may also temporarily change but is eventually stabilized to the reference current level. For example, when the voltage level of the power supply VADD increases by 10%, the reference current source 11 may allow the first current $I_1$ having the same reference current level to flow between the power supply VADD and the ground regardless of the increase in voltage level.

The dependent current source 12 allows a second current $I_2$ to flow through a second current path between the power supply VADD and the ground. The second current $I_2$ is proportional to the first current $I_1$ and has a constant current level like the first current $I_1$. For example, according to an embodiment, the second current $I_2$ has the same current level as the first current $I_1$.

According to an embodiment, the dependent current source 12 is mirrored to the reference current source so that as the current level of the reference current source 11 changes, the current level of the dependent current source 12 changes accordingly. However, since the current level of the reference current source 11 remains constant, the dependent current source 12 also has a constant current level. For example, the dependent current source 12 has a current level that remains invariant to fluctuations in the voltage level of the power supply VADD. According to an embodiment, like the reference current source 11, the dependent current source 12 has an independent reference current level.

The delay unit 21 includes an inverting portion 22, a dependent current supply 23, and a dependent current sinker 24.

The inverting portion 22 inverts input data and outputs the inverted data. According to an embodiment, the inverting portion 22 is realized as an inverter or logic gate using a plurality of transistors. The inverting portion 22 has a finite switching time (other than 0) due to unavoidable capacitance between an output terminal and a ground. The capacitance is expressed in terms of an equivalent circuit as a load capacitor between the output terminal and the ground. The load capacitor requires time to charge and discharge so that the inverting portion 22 may output a high level and a low level, respectively. The charging time and discharging time for the load transistor correspond to the switching time.

The dependent current supply 23 provides a driving voltage to the inverting portion 22 while supplying a third current $I_3$ to the load capacitor. The third current $I_3$ is proportional to the first current $I_1$ and has a constant current level like the first current $I_1$. Thus, the load capacitor is charged with the constant third current $I_3$.

The dependent current sinker 24 provides a ground voltage to the inverting portion 22 while drawing a fourth current $I_4$ from the load capacitor. The fourth current $I_4$ is proportional to the second current $I_2$ and has a constant current level like the second current $I_2$. Thus, the load capacitor is discharged with the constant fourth current $I_4$. Accordingly, the switching time of the inverting portion 22 is kept constant.

Figure 7:
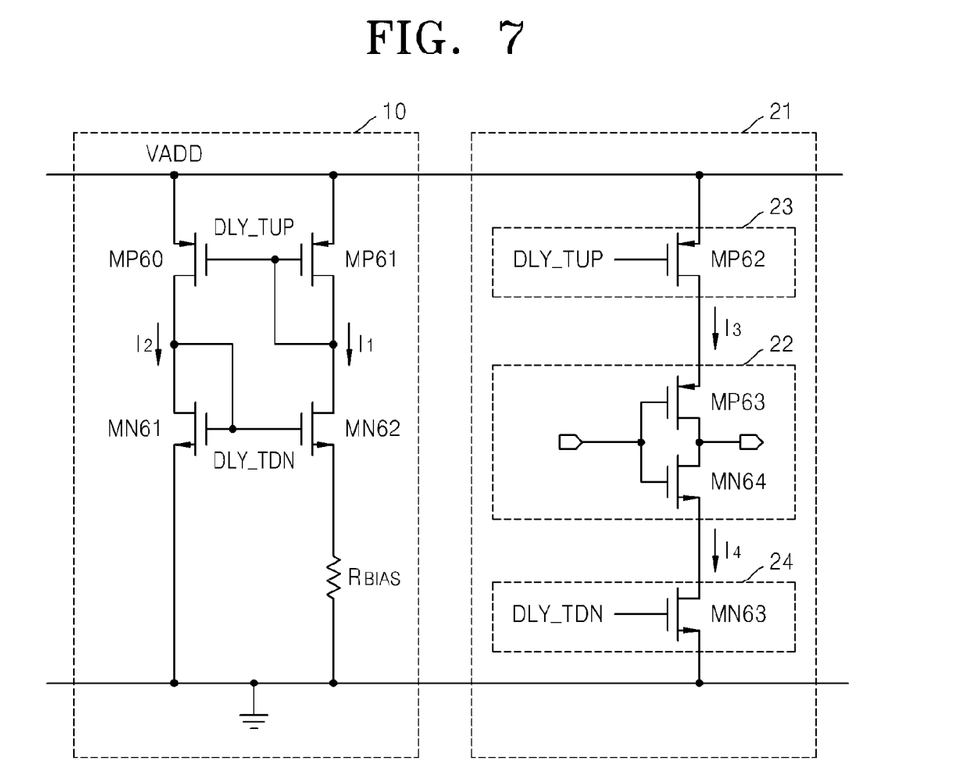
FIG. 7 is a circuit diagram of a bias circuit and a delay unit according to embodiments of the present inventive concept.

FIG. 7 is a circuit diagram illustrating the bias circuit 10 and the delay unit 21 according to an embodiment of the present inventive concept.

Referring to FIG. 7, the bias circuit 10 according to the present embodiment includes P-type metal-oxide-semiconductor field-effect transistors (PMOSFETs) MP60 and MP61, N-type MOSFETs (NMOSFETs) MN61 and MN62, and a bias resistor $R_{BIAS}$.

The PMOSFET MP60 has a source coupled to the power supply VADD and a drain coupled to a drain of the NMOSFET MN61. The NMOSFET MN61 has a drain connected to its gate and a source grounded. The PMOSFET MP61 has a source connected to the power supply VADD and a drain connected to its gate and a drain of the NMOSFET MN62. The NMOSFET MN62 has its source grounded through the bias resistor $R_{BIAS}$. The gates of the PMOSFETs MP60 and MP61 are connected with each other. Similarly, the gates of the NMOSFETs MN61 and MN62 are connected with each other.

When the bias circuit 10 operates normally, the PMOSFETs MP60 and MP61 and the NMOSFETs MN61 and MN62 are turned on. Since the PMOSFETs MP60 and MP61 constitute a current mirror, a current flowing through the PMOSFET MP61 is directly proportional to a current flowing through the PMOSFET MP60. The first current $I_1$ flows through the PMOSFET MP61, the NMOSFET MN62, and the bias resistor $R_{BIAS}$, and the second current $I_2$ flows through the PMOSFET MP60 and the NMOSFET MN61.

The delay unit 21 according to the present embodiment includes PMOSFETs MP62 and MP63 and NMOSFETs MN63 and MN64. The PMOSFET MP63 and the NMOSFET MN64 constitute the inverting portion 22. The PMOSFET MP62 and the NMOSFET MN63 respectively constitute the dependent current supply 23 and the dependent current sinker 24.

Gates of the PMOSFET MP63 and NMOSFET MN64 are connected with each other to form an input terminal of the inverting portion 22, and drains of the PMOSFET MP63 and NMOSFET MN64 are connected with each other to form an output terminal of the inverting portion 22. The PMOSFET MP63 has its source coupled to a drain of the PMOSFET MP62, and the NMOSFET MN64 has its source coupled to a drain of the NMOSFET MN63.

Sources of the PMOSFET MP62 and the NMOSFET MN63 are connected to the power supply VADD and the ground, respectively. The PMOSFETs MP62 and MP61 have their gates connected with each other to constitute a current mirror. Thus, the third current $I_3$ flowing through the PMOSFET MP63 is directly proportional to the first current $I_1$ flowing through the PMOSFET MP61. Furthermore, a gate voltage for the PMOSFET MP61 is fed into the gate of the PMOSFET MP62 as a bias signal DLY_TUP.

The NMOSFETs MN63 and MN61 have their gates connected with each other to constitute a current mirror. Thus, the fourth current $I_4$ flowing through the NMOSFET MN63 is directly proportional to the second current $I_2$ flowing through the NMOSFET MN61. Furthermore, a gate voltage for the NMOSFET MN61 is fed into the gate of the NMOSFET MN63 as a bias signal DLY_TDN.

Figure 8:
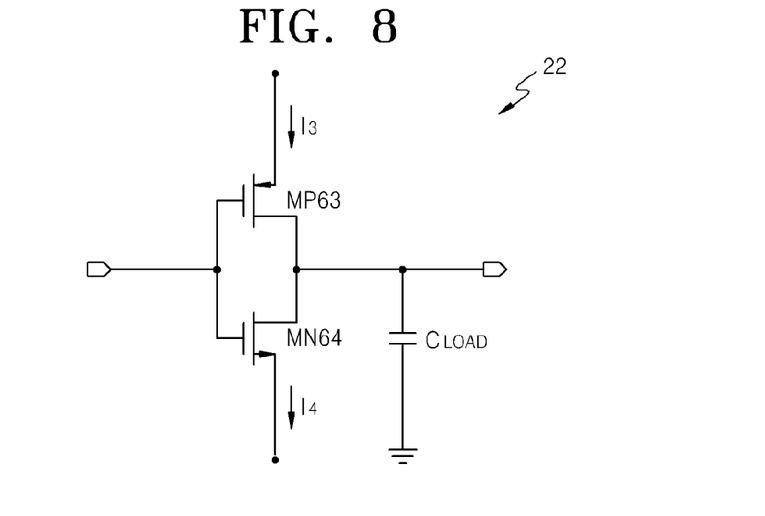
FIG. 8 is a diagram for explaining switching time for the inverting portion shown in FIG. 7.

FIG. 8 is a diagram for describing a switching time for the inverting portion 22.

Referring to FIG. 8, the inverting portion 22 includes the PMOSFET MP63 and the NMOSFET MN64. The PMOSFET MP63 and the NMOSFET MN64 constitute an inverter. For example, internal capacitances of the PMOSFET MP63 and the NMOSFET MN64, such as internal capacitances between the gate and drain of the PMOSFET MP63, between the gate and drain of the NMOSFET MN64, between the source and drain of the PMOSFET MP63, and between the source and drain of the NMOSFET MN64, and capacitance between the output terminal and another transistor or between interconnects may be expressed in terms of an equivalent circuit as a load capacitor $C_{LOAD}$ between the output terminal and the ground.

When a low level voltage is applied to an input terminal, the PMOSFET MP63 is turned on, the NMOSFET MN64 is turned off, and the load capacitor $C_{LOAD}$ is charged with the third current $I_3$. When the load capacitor $C_{LOAD}$ is charged so that a voltage between two terminals of the load capacitor $C_{LOAD}$ exceeds a predetermined threshold, the output terminal outputs a high level voltage.

When a high level voltage is applied to an input terminal, the PMOSFET MP63 is turned off, the NMOSFET MN64 is turned on, and the load capacitor $C_{LOAD}$ is discharged with the fourth current $I_4$. When the load capacitor $C_{LOAD}$ is discharged so that a voltage between two terminals of the load capacitor $C_{LOAD}$ is lower than a predetermined threshold, the output terminal outputs a low level voltage.

As described above, a switching time for the inverting portion 22 corresponds to a charging time and a discharging time of the load capacitor $C_{LOAD}$. Since the load capacitor $C_{LOAD}$ is charged and discharged with a constant level of current, the charging time and discharging time are also kept constant. Thus, the delay circuit 162 including the inverting portion 22 can have a constant delay time.

The principle of generating a constant reference current in the bias circuit 10 according to an embodiment is now described in detail with reference to FIG. 7

The first current $I_1$ flowing through NMOSFET MN62 and the second current $I_2$ flowing through the NMOSFET MN61 are defined by Equation (1):

$$I_1 = \frac{1}{2}k'_n\left(\frac{W}{L}\right)_{62}(V_{GS62} - V_t)^2 \qquad (1)$$
$$I_2 = \frac{1}{2}k'_n\left(\frac{W}{L}\right)_{61}(V_{GS61} - V_t)^2$$

Here, $k'_n$ is a constant that is determined by a process used to fabricate MOS transistors and is referred to as a process transconductance parameter. $(W/L)_{62}$ and $(W/L)_{61}$ respectively denote aspect ratios, i.e., the ratios (W/L) of channel width W to channel length L, of the NMOSFETs MN62 and MN61. $V_{GS62}$ and $V_{GS61}$ respectively represent gate-to-source voltages of the NMOSFETs MN62 and MN61, and $V_t$ represents a threshold voltage.

Referring to FIG. 7, the gate-to-source voltage $V_{GS61}$ of the NMOSFET MN61 has the following relationship with the gate-to-source voltage $V_{GS62}$ of the NMOSFET MN62:

$$V_{GS61} = V_{GS62} + I_1 R_{BIAS} \qquad (2)$$

With the first current $I_1$ having the same level as the second current $I_2$ due to the current mirror consisting of the PMOSFETs MP61 and MP60, $V_{GS62}$ and $V_{GS61}$ are substituted into the above Equation (1), and the Equation (1) is rearranged with respect to the first current $I_1$ as follows:

$$I_1 = \frac{2}{k'_n (W/L)_{62} R_{BIAS}^2} \left( \sqrt{\frac{(W/L)_{62}}{(W/L)_{61}}} - 1 \right)^2 \qquad (3)$$

The Equation (3) shows that the first current $I_1$ is determined by only the size of the NMOSFET MN62, bias resistance $R_{BIAS}$, and the size ratio between the NMOSFETs MN62 and MN61. For example, the first current $I_1$ is constant regardless of fluctuations in the voltage level of the power supply VADD. Thus, the first current $I_1$ remains invariant to fluctuations in the voltage level of the power supply VADD due to changes in the external environment. The current level of the first current $I_1$ is referred to as a reference current level.

According to an embodiment, the delay time TD is adjusted by controlling the bias resistance $R_{BIAS}$. As shown in Equation (3), the first current $I_1$ is inversely proportional to the square of the bias resistance $R_{BIAS}$. Thus, as the bias resistance $R_{BIAS}$ increases, the first current $I_1$ decreases together with the third current $I_3$ and the fourth current $I_4$ that are respectively supplied by and discharged from a load capacitor of the delay unit 21. Accordingly, the switching time for the delay unit 21 will increase. Conversely, as the bias resistance $R_{BIAS}$ decreases, the delay time TD decreases.

Furthermore, since a transconductance $g_{m62}$ of the NMOSFET MN62 is defined by the Equation (4):

$$\sqrt{2k'_n (W/L)_{62} I_1} = g_{m62} \qquad (4)$$

The transconductance $g_{m62}$ of the NMOSFET MN62 is determined as Equation (5):

$$g_{m62} = \frac{2}{R_{BIAS}} \left( \sqrt{\frac{(W/L)_{62}}{(W/L)_{61}}} - 1 \right) \qquad (5)$$

As shown in the Equation (5), the transconductance $g_{m62}$ of the NMOSFET MN62 is determined by the bias resistance $R_{BIAS}$ and the size ratio between the NMOSFETs MN62 and MN61, regardless of fluctuations in the voltage level of the power supply VADD. For example, the transconductance $g_{m62}$ of the NMOSFET MN62 depends on the geometrical ratio regardless of changes in Process-Voltage-Temperature (PVT) parameters and other greatly fluctuating parameters.

Because as described above, the PMOSFETs MP60 and MP61 and the NMOSFETs MN61 and MN62 constitute a self-bias network, the first and second currents $I_1$ and $I_2$ flowing through the PMOSFETs MP60 and MP61 and the NMOSFETs MN61 and MN62 stay stable. Furthermore, the third and fourth currents $I_3$ and $I_4$ flowing through the PMOSFET MP62 of the dependent current supply 23 and the NMOSFET MN63 of the dependent current sinker 24 also remain stable since the third and fourth currents $I_3$ and $I_4$ are directly proportional to the first and second currents $I_1$ and $I_2$ due to current mirroring. Thus, the delay circuit 162 can have a stable delay time TD.

According to an embodiment, one of the PMOSFET MP62 and the NMOSFET MN63 in the delay unit 21 may be omitted, so that even though delay times corresponding to charging time and discharging time are asymmetric, accuracy of a total delay time TD is determined by stability of the first current $I_1$ generated by the bias circuit 10. Thus, the total delay time TD may be kept constant regardless of changes in the external environment.

As described above with reference to FIG. 7, the bias circuit 10 and the delay unit 21 are implemented using MOSFETs. However, alternatively, the bias circuit 10 and the delay unit 21 are implemented using other types of transistors, such as bipolar junction transistors (BJTs). Furthermore, although the inverting portion is implemented as an inverter that is realized by using two transistors, the inverting portion may be implemented using logic gates.

Figure 9:
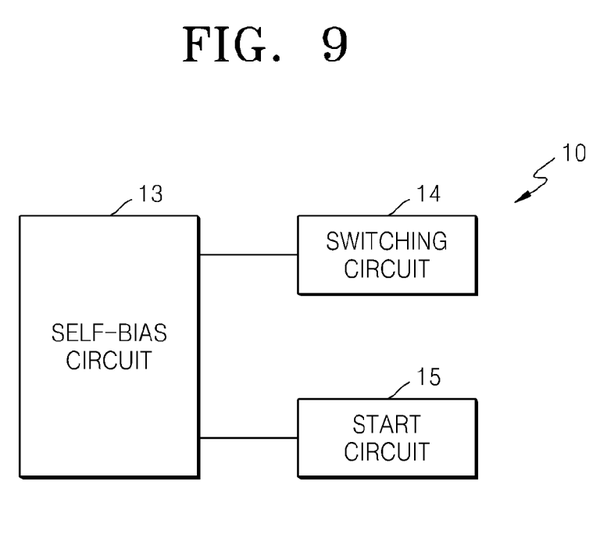
FIG. 9 is a schematic block diagram of a bias circuit according to another embodiment of the present inventive concept.

FIG. 9 is a schematic block diagram of a bias circuit 10 according to an embodiment of the present inventive concept.

Referring to FIG. 9, the bias circuit 10 includes a self-bias circuit 13, a switching circuit 14, and a start circuit 15.

The self-bias circuit 13 self-biases the first current $I_1$ and the second current $I_2$ shown in FIG. 6. According to an embodiment, the self-bias circuit 13 is implemented by the PMOSFETs MP60 and MP61, the NMOSFETs MN61 and MN62, and the bias resistor $R_{BIAS}$.

The switching circuit 14 activates or deactivates the self-bias circuit 13 in response to a control signal. The start circuit 15 starts the operation of the self-bias circuit 13 in a zero state.

Figure 10:
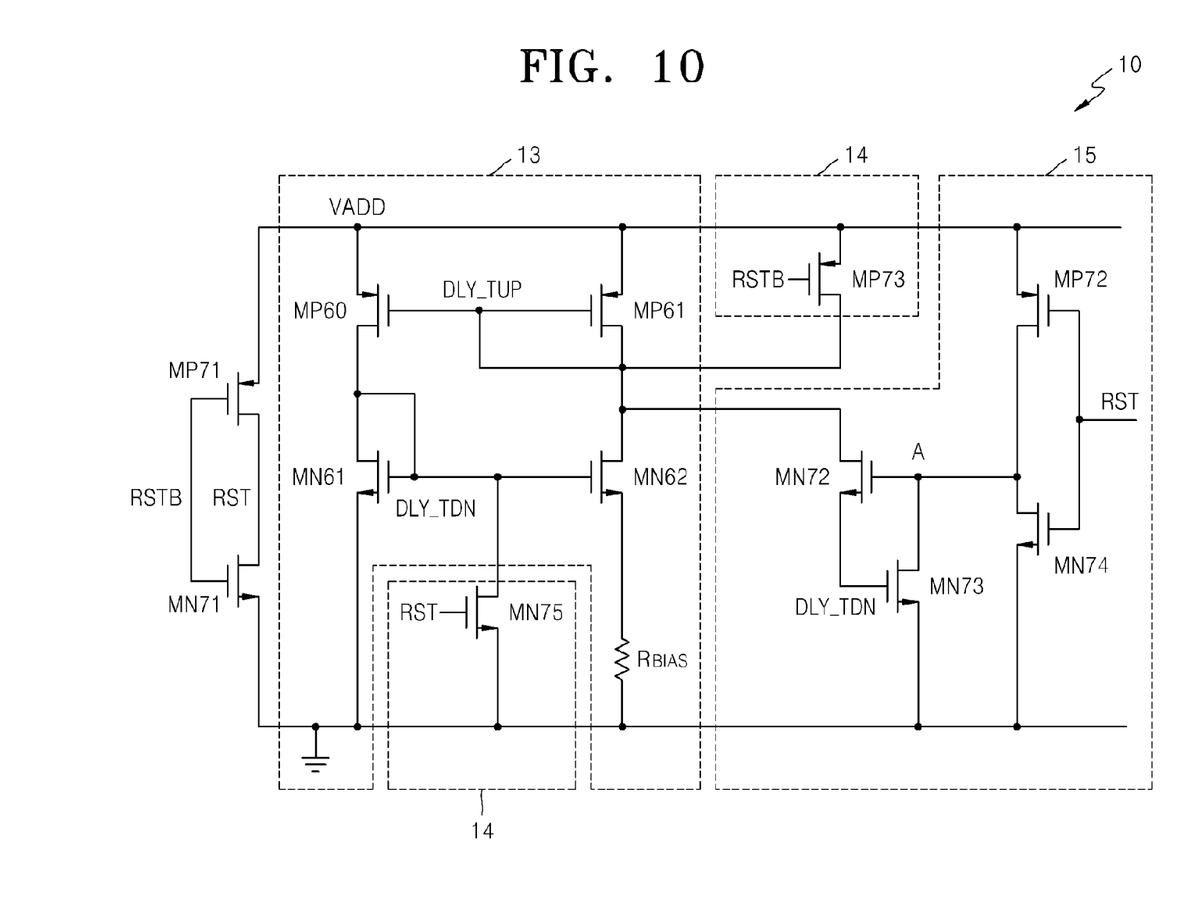
FIG. 10 is a detailed circuit diagram of the bias circuit of FIG. 9.

FIG. 10 is a detailed circuit diagram of the bias circuit 10 of FIG. 9.

Referring to FIGS. 9 and 10, the bias circuit 10 shown in FIG. 7 corresponds to the self-bias circuit 13 shown in FIG. 10. The bias circuit 10 of FIG. 10 further includes the switching circuit 14 for activating or deactivating the self-bias circuit 13 and the start circuit 15 for releasing the zero state of the self-bias circuit 13.

The switching circuit 14 includes a PMOSFET MP73 and an NMOSFET MN75. The PMOSFET MP73 has a source connected to a power supply VADD, a drain connected to a gate of the PMOSFET MP60, and a gate for receiving a control signal RSTB. The NMOSFET MN75 has a source connected to a ground, a drain connected to a gate of the NMOSFET MN61, and a gate for receiving a control signal RST.

When the control signals RSTB and RST have high and low levels, respectively, the PMOSFET MP73 and the NMOSFET MN75 are turned off while the self-bias circuit 13 operates normally. When the control signals RSTB and RST have low and high levels, respectively, the PMOSFET MP73 and the NMOSFET MN75 are turned on, voltages at the gates of the PMOSFETs MP60 and MP61 are pulled up, and voltages at the gates of the NMOSFETs MN61 and MN62 are pulled down, which causes the PMOSFETs MP60 and the MP61 and the NMOSFETs MN61 and MN62 to turn off, thereby deactivating the self-bias circuit 13.

The start circuit 15 includes a PMOSFET MP72 and NMOSFETs MN72, MN73, and MN74. The PMOSFET MP72 has a gate connected to a gate of the NMOSFET MN74 and receiving the control signal RST, a source connected to the power supply VADD, and a drain connected to a drain of the NMOSFET MN74, a gate of the NMOSFET MN72, and a drain of the NMOSFET MN73. A source of the NMOSFET MN74 is grounded. The NMOSFET MN72 has a drain connected to a drain of the PMOSFET MP61 and a source connected to gates of the NMOSFET MN73 and NMOSFET MN61. A source of the NMOSFET MN73 are grounded.

When the control signal RSTB goes from low to high and the control signal RST goes from high to low, gate nodes DLY_TUP and DLY_TDN of the PMOSFETs MP60 and MP61 and NMOSFETs MN61 and MN62 float so that the PMOSFETs MP60 and MP61 and NMOSFETs MN61 and MN62 are not turned on and remain in an off state. This state is also referred to as a zero-current state or zero state. For example, even when the control signal RSTB is at high level and the control signal RST is at low level, the self-bias circuit 13 can be deactivated.

When the control signal RST is at a low level, the PMOSFET MP72 is turned on so that a node A is pulled up. As a consequence, the NMOSFET MN72 having a gate connected to the node A is turned on and electrically connects a node DLY_TUP coupled to its drain with a node DLY_TDN coupled to its source. Thus, voltage levels of the nodes DLY_TUP and DLY_TDN have an intermediate potential, for example, VADD/2, so that the PMOSFETs MP60 and MP61 and NMOSFETs MN61 and MN62 are turned on. Accordingly, the zero-current state of the self-bias circuit 13 is released.

The NMOSFET MN73 having a gate connected to the node DLY_TDN is also turned on so that the voltage level of the node A becomes low sufficiently to turn off the NMOSFET MN72 since the NMOSFET MN73 has higher electron mobility than the PMOSFET MP72. The NMOSFET MN72 is then turned off so that an electrical connection between the nodes DLY_TUP and DLY_TDN will open. Thus, the normal operation of the self-bias circuit 13 is not affected by the start circuit 15.

The bias circuit 10 further includes the PMOSFET MP71 and NMOSFET MN71. The PMOSFET MP71 has a source connected to the power supply VADD and a drain connected to a drain of the NMOSFET MN71. The NMOSFET MN71 has its source grounded. Gates of the PMOSFET MP71 and NMOSFET MN71 are connected with each other.

The control signal RST is inverted with respect to the control signal RSTB using the PMOSFET MP71 and the NMOSFET MN71. When the control signal RSTB is at a high level, the NMOSFET MN71 is turned on and the low level control signal RST is generated. When the control signal RSTB is at a low level, the NMOSFET MN71 is turned off and the PMOSFET MP71 is turned on and the high level control signal RST is generated. According to an embodiment, the controls signals RSTB and RST may be generated by different circuits.

Furthermore, while an inverter including the PMOSFET MP63 and the NMOSFET MN64 acts as a delay unit, other types of inverters and different types of delay units, such as gate circuits may be replaced with the inverter. By using currents that are directly proportional to reference constant current provided by the bias circuit 10, load capacitors for the different types of delay units can be charged and discharged, thereby achieving the same or similar effects.

A lock detector according to the embodiments of the present inventive concept employs a self-bias circuit that provides reference constant current for maintaining constant the delay time of a delay circuit. The stability of the reference constant current depends on only sizes of MOSFETs in the self-bias circuit regardless of PVT parameters and other greatly fluctuating parameters. Thus, the accuracy of the delay time of the delay circuit is improved, thereby enhancing detection accuracy of the lock detector.

While the inventive concept has been particularly shown and described with reference to exemplary embodiments thereof, it will be understood that various changes in form and details may be made therein without departing from the spirit and scope of the following claims.

What is claimed is:

1. A phase-locked loop (PLL) circuit comprising:
   a comparator configured to compare phases of an input clock signal and an output clock signal to generate phase comparison signals;
   a pulse generator configured to generate a first pulse signal based on the phase comparison signals;
   a bias circuit configured to generate a first current and a second current proportional to the first current, wherein the first current is stabilized to a predetermined reference current level;
   a delay circuit configured to draw third and fourth currents proportional to the first and second currents, respectively, and configured to receive the first pulse signal to generate a second pulse signal by delaying the first pulse signal using the third and fourth currents;
   a charge pump configured to receive the phase comparison signals;
   a loop filter configured to receive an output from the charge pump;
   a voltage-controlled oscillator configured to receive an output from the loop filter;
   a frequency divider configured to receive an output from the voltage-controlled oscillator and to provide the output clock signal to the comparator; and
   a lock detector comprising the pulse generator and the delay circuit.

2. The circuit of claim 1, wherein the bias circuit comprises:
   a first N-type metal-oxide-semiconductor field-effect transistor (NMOSFET) and a bias resistor through which the first current flows;
   a second NMOSFET through which the second current flows; and
   a current mirror mirroring the second current from the first current,
   wherein the first NMOSFET has a drain coupled to the power supply through the current mirror and a source coupled to the ground through the bias resistor, and wherein a gate and a drain of the second NMOSFET and a gate of the first NMOSFET are jointly connected to the power supply through the current mirror, and a source of the second NMOSFET is connected to the ground.

3. The circuit of claim 2, wherein the reference current level of the first current depends on a size of the first NMOSFET, a value of the bias resistor, and a size ratio between the first and second NMOSFETs.

4. The circuit of claim 2, wherein a rate of a current level of the first current to a current level of the second current is 1:1.

5. The circuit of claim 1, wherein the delay circuit comprises at least one delay unit including an inverting portion having an input terminal and an output terminal,
   wherein the inverting portion includes a load capacitor equivalently present between the output terminal and the ground, and
   wherein the load capacitor is charged and discharged with the third current and the fourth current, respectively, at constant speed.

6. The circuit of claim 1, wherein the third current and the fourth current are mirrored to the first current and the second current, respectively.

7. The circuit of claim 1, wherein the bias circuit comprises:
   a self-bias circuit configured to self-bias the first current and the second current;

a switching circuit configured to activate or deactivate the self-bias circuit in response to a first signal; and a start circuit configured to release a zero state of the self-bias circuit.

8. A phase-locked loop circuit including a lock detector, the lock detector comprising:

a delay circuit including a load capacitor; and a bias circuit configured to generate a constant reference current, wherein the load capacitor is charged or discharged with a current whose level is dependent upon the reference current.

9. The phase-locked loop circuit of claim 8, wherein the bias circuit comprises:

first and second P-type transistors, wherein sources of the P-type transistors are connected to the power supply, gates of the P-type transistors are connected to each other;

first and second N-type transistors, wherein drains of the P-type transistors are respectively connected to drains of the N-type transistors, gates of the N-type transistors are connected to each other, and a source of the first N-type transistor is connected to a ground; and a bias resistor, wherein source of the second N-type transistor is connected to the ground via the bias resistor, and wherein the gate and the drain of the second P-type transistor are connected to each other, and the gate and the drain of the first N-type transistor are connected to each other.

10. The phase-locked loop circuit of claim 9, wherein the delay circuit comprises:

third and fourth P-type transistors, wherein a source of the third P-type transistor is connected to the power supply, a gate of the third P-type transistor is connected to the gate of the second P-type transistor, and a drain of the third P-type transistor is connected to a source of the fourth P-type transistor; and third and fourth N-type transistors, wherein a source of the third N-type transistor is connected to the ground, a gate of the third N-type transistor is connected to the gate of the first N-type transistor, and a drain of the third N-type transistor is connected to a source of the fourth N-type transistor, and wherein a gate and a drain of the fourth P-type transistor are respectively connected to a gate and a drain of the fourth N-type transistor.

11. The phase-locked loop circuit of claim 10, wherein the fourth P-type transistor and the fourth N-type transistor constitute an inversion portion that includes an input terminal connected to the gates of the fourth P-type transistor and the fourth N-type transistor and an output terminal connected to the drains of the fourth P-type transistor and the fourth N-type transistor, wherein the load capacitor is an equivalent capacitor between the output terminal and the ground.

12. The circuit of claim 1, further comprises:

a trigger configured to detect a lock state of the PLL circuit based on the first pulse signal and the second pulse signal.

13. The circuit of claim 2, wherein the delay circuit comprises:

third and fourth PMOSFETs and third and fourth NMOSFETs, wherein the third PMOSFET has a source connected to the power supply and a drain connected to a source of the fourth PMOSFET, the fourth PMOSFET has its drain connected to a drain of the third NMOSFET, the third NMOSFET has its source connected to a drain of the fourth NMOSFET, and the fourth NMOSFET has its source connected to the ground, wherein gates of the third PMOSFET, and the fourth NMOSFET are respectively connected to gates of the second PMOSFET, and the second NMOSFET, and wherein the gate of the fourth PMOSFET receives the first pulse signal and the drain of the fourth PMOSFET outputs the second pulse signal.

14. The circuit of claim 8, further comprises:

a comparator configured to compare phases of an input clock signal and an output clock signal to generate phase comparison signals;

a charge pump configured to receive the phase comparison signals;

a loop filter configured to receive an output from the charge pump;

a voltage-controlled oscillator configured to receive an output from the loop filter;

a frequency divider configured to receive an output from the voltage-controlled oscillator and to provide the output clock signal to the comparator.

* * * * *